(12) United States Patent
Kuroda et al.

(10) Patent No.: US 6,370,010 B1
(45) Date of Patent: Apr. 9, 2002

(54) MULTI-LAYER CAPACITOR, WIRING BOARD, AND HIGH-FREQUENCY CIRCUIT

(75) Inventors: Yoichi Kuroda, Fukui; Masaaki Taniguchi, Fukui-ken; Yasuyuki Naito, Takefu; Haruo Hori; Takanori Kondo, both of Sabae, all of (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 09/511,557

(22) Filed: Feb. 23, 2000

(30) Foreign Application Priority Data

Oct. 18, 1999 (JP) ............................................ 11-294908

(51) Int. Cl.$^7$ ........................ H01G 4/228; H01G 4/005; H01G 2/20
(52) U.S. Cl. .................. 361/306.1; 361/303; 361/308.1
(58) Field of Search ........................... 341/301.2, 301.4, 341/303–305, 306.1–306.3, 307, 308.1–308.3, 310–312, 313, 321.1–321.5

(56) References Cited

U.S. PATENT DOCUMENTS

| | | | | |
|---|---|---|---|---|
| 5,369,545 A | * | 11/1994 | Bhattacharyya et al. | 361/306.2 |
| 5,590,016 A | * | 12/1996 | Fujishiro et al. | 361/313 |
| 5,657,199 A | * | 8/1997 | Devoe et al. | 361/328 |
| 5,774,326 A | * | 6/1998 | McConnelee et al. | 361/313 |
| 5,880,925 A | | 3/1999 | DuPre et al. | |
| 6,072,687 A | * | 6/2000 | Naito et al. | 361/303 |
| 6,088,215 A | * | 7/2000 | Webb et al. | 361/306.3 |

FOREIGN PATENT DOCUMENTS

| | | |
|---|---|---|
| DE | 25 45 672 | 4/1977 |
| FR | 1464631 | 7/1965 |
| FR | 2 707 123 | 1/1996 |
| JP | 60-158612 | 8/1985 |
| JP | 2-159008 | 6/1990 |
| JP | 2-256216 | 10/1990 |
| JP | 2-149031 | 2/1992 |
| JP | 5-205966 | 8/1993 |
| JP | 6-140283 | 5/1994 |
| JP | 7-201651 | 8/1995 |
| JP | 7-326536 | 12/1995 |
| JP | 8-172026 | 7/1996 |
| JP | 11-144996 | 5/1999 |

* cited by examiner

Primary Examiner—Dean A. Reichard
Assistant Examiner—Eric W. Thomas
(74) Attorney, Agent, or Firm—Keating & Bennett, LLP

(57) ABSTRACT

A multi-layer capacitor includes first and second side-surface terminal electrodes alternately arranged on four side surfaces of a capacitor body. First and second major-surface terminal electrodes are arranged on a major surface of the capacitor body. First and second internal electrodes which are opposed to each other within the capacitor body are respectively electrically connected at ends thereof to the first and second side-surface terminal electrodes, and are also respectively electrically connected to the first and second major-surface terminal electrodes through via hole conductors. With this arrangement, the directions of the currents flowing within the multi-layer capacitor are diversified, and the lengths of current-carrying paths are shortened so as to achieve a very low ESL value.

77 Claims, 9 Drawing Sheets

MULTI-LAYER CAPACITOR, WIRING BOARD, AND HIGH-FREQUENCY CIRCUIT

BACKGROUND OF THE INVENTION

1. Field of the Invention

The present invention relates to a multi-layer capacitor, a wiring board, and a high-frequency circuit, and, more particularly, to a multi-layer capacitor useful in a high-frequency circuit, and a wiring board and a high-frequency circuit, both of which include the multi-layer capacitor.

2. Description of the Related Art

The most common multi-layer capacitor conventionally available is constructed of a ceramic dielectric material, for example, and includes a plurality of dielectric layers laminated with an internal electrode interposed therebetween. To construct a plurality of capacitors, a plurality of pairs of first and second internal electrodes are alternately laminated with particular dielectric layers sandwiched therebetween in the direction of lamination. A capacitor body is thus constructed.

First and second external terminal electrodes are respectively disposed on first and second end surfaces of the capacitor body. The first internal electrode has a lead extending to the first end surface of the capacitor body, and the lead is electrically connected to the first external terminal electrode. The second internal electrode has a lead extending to the second end surface, and the lead is electrically connected to the second external terminal electrode.

In the multi-layer capacitor, a current flows from the second external terminal electrode to the first external terminal electrode. More specifically, the current flows from the second external terminal electrode to the second internal electrode, and flows to the first internal electrode via a dielectric layer from the second internal electrode, and finally reaches the first external terminal electrode via the first internal electrode.

The equivalent circuit of the capacitor is a serial connection of C, L, and R, where C represents the capacitance of the capacitor, L represents an equivalent series inductance (ESL), and R represents an equivalent series resistance (ESR) which mainly consists of the resistance of the electrodes.

The equivalent circuit of the capacitor has a resonance frequency of $f_0 = 1/\{2\pi(LC)^{1/2}\}$, and cannot function as a capacitor in a frequency range above the resonance frequency. In other words, the smaller the inductance L, namely, ESL, is, the higher the resonance frequency $f_0$ becomes, and the capacitor accordingly can work on a higher frequency. Although making the internal electrode of copper to reduce ESR has been contemplated, a capacitor having a small ESL is required if it is intended for use in a microwave range.

A low ESL is also required of a capacitor which is used as a decoupling capacitor connected to a power supply circuit which feeds power to a microprocessing unit (MPU) chip for use in a work station or a personal computer.

Figure 19:
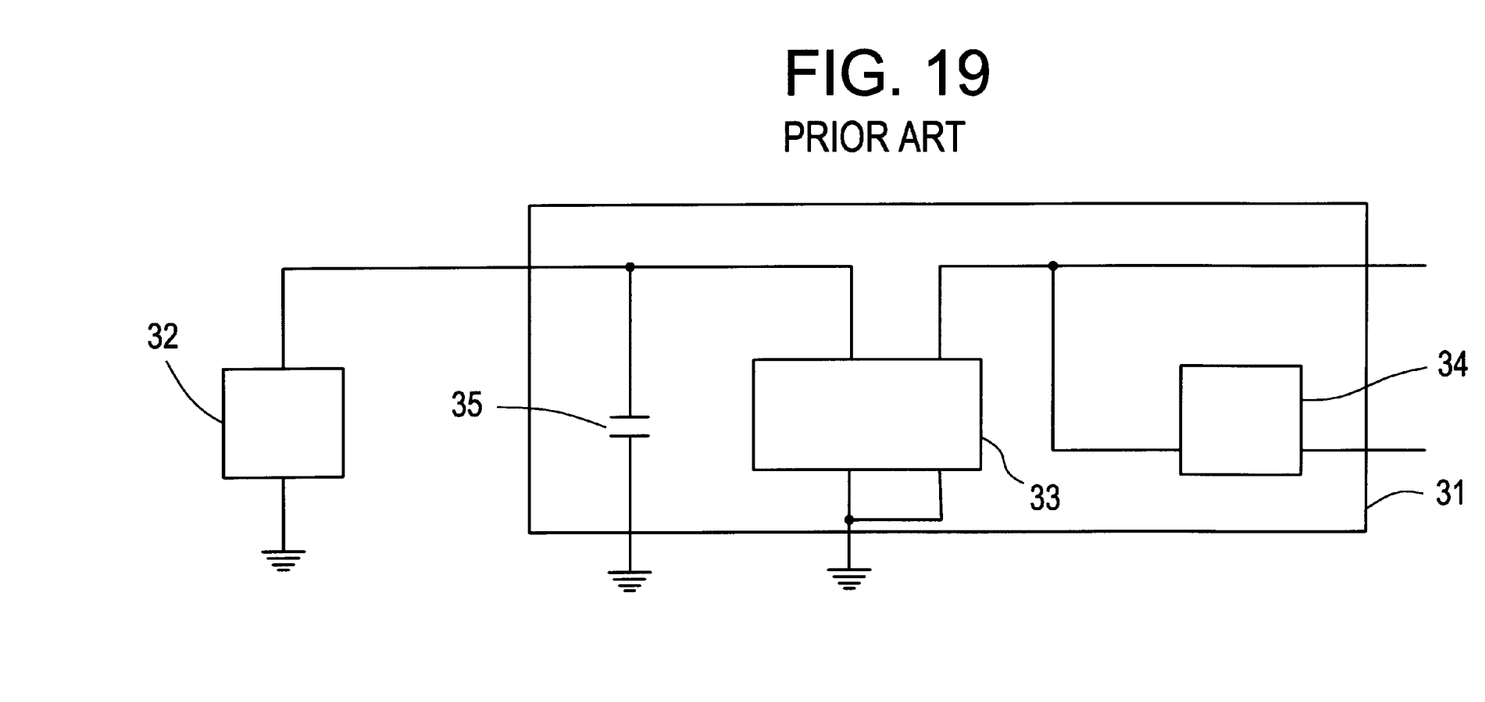
FIG. 19 is a block diagram diagrammatically showing the configuration of a microprocessing unit and a power supply, relating to the present invention.

FIG. 19 is a block diagram showing an example of the configuration of the above-referenced MPU 31 and a power supply 32.

Referring to FIG. 19, MPU 31 includes an MPU chip 33 and a memory 34. The power supply 32 feeds power to the MPU chip 33. A decoupling capacitor 35 is connected along the power line that extends from the power supply 32 to the MPU chip 33. Signal lines extend between the MPU chip 33 and the memory 34.

Like an ordinary decoupling capacitor, the decoupling capacitor 35, associated with MPU 31, is used to absorb noise and smooth fluctuations in power supply voltage. The MPU chip 33 has an operating frequency of 500 MHz or higher, and some chips reaching an operating frequency of 1 GHz are currently under development. In high-speed applications keeping pace with such an MPU chip 33, a quick power supply function is required of the capacitor. The quick power supply function feeds power from electricity stored in a capacitor within several nanoseconds when power is instantaneously needed, such as at startup.

The MPU 31 thus needs a decoupling capacitor 35 having an inductance as low as possible, for example, 10 pH or lower inductance. Thus, a capacitor having a low inductance is needed for functioning as the decoupling capacitor.

For instance, an MPU chip 33 having an operating clock frequency of 450 MHz is now supplied with 1.8 volts to 2.0 volts DC, and its power consumption is 23 W, i.e., with a current of 12 A being drawn. To reduce the power consumption, the MPU 31 is set to operate in a sleep mode at a power consumption of 1 W when not in use. When the MPU 31 is changed from sleep mode to an active mode, the MPU chip 33 needs to be supplied with power enough for the active mode to start within several clocks. At the operating clock frequency of 450 MHz, power must be supplied within 4 to 7 nanoseconds when the MPU 31 is changed from the sleep mode to the active mode.

Since the power feeding from the power supply 32 is not fast enough, the charge stored in the decoupling capacitor 35 in the vicinity of the MPU chip 33 is first discharged to feed power to the MPU chip 33 until the power feeding from the power supply 32 starts.

At an operating clock frequency of 1 GHz, the ESL value of the decoupling capacitor 35 in the vicinity of the MPU chip 33 needs to be 10 pH or smaller for the decoupling capacitor 35 to function in the manner described above.

The ESL of typical multi-layer capacitors ranges from 500 pH to 800 pH, which is far from the above-referenced value 10 pH. Such an inductance component is created in the multi-layer capacitor because a magnetic flux, the direction of which is determined by a current flowing through the multi-layer capacitor, is created, and a self inductance is created due to the magnetic flux.

Under these situations, the structures of multi-layer capacitors that can achieve a low ESL have been proposed in U.S. Pat. No. 5,880,925, Japanese Unexamined Patent Publication No. 2-159008, Japanese Unexamined Patent Publication No. 11-144996, and Japanese Unexamined Patent Publication No. 7-201651.

The above disclosed method of achieving a low ESL is primarily based on the cancellation of magnetic fluxes induced in the multi-layer capacitor. To cancel magnetic fluxes, the direction of a current flowing in the multi-layer is diversified. To diversify the direction of the current, the number of terminal electrodes disposed on the external surface of the capacitor body is increased so that the number of leads of internal electrodes electrically connected to the respective external terminal electrodes is increased. At the same time, the leads of the internal electrodes are aligned in several different directions.

The effectiveness of the proposed method of achieving a low ESL in the multi-layer capacitor is not sufficient.

For example, U.S. Pat. No. 5,880,925 and Japanese Unexamined Patent Publication No. 2-159008 disclose a structure in which the leads of internal electrodes extend to opposing sides of a capacitor body. It is estimated that such a structure achieves a low ESL of about 100 pH.

Japanese Unexamined Patent Publication No. 11-144996 discloses a structure in which the leads of internal electrodes extend to four sides of a capacitor-body, and describes that the best ESL value is 40 pH.

Japanese Unexamined Patent Publication No. 7-201651 discloses a structure in which the leads of the internal electrodes extend to the top and bottom major surfaces of a capacitor body, and describes that the best ESL value is 50 pH.

For this reason, a plurality of multi-layer capacitors connected in parallel must be conventionally mounted on a wiring board to achieve an ESL value as low as 10 pH in a high-frequency circuit having a multi-layer capacitor for an MPU chip (including a power supply line). As a result, the mounting area required for the plurality of multi-layer capacitors increases, which prevents achievement of a compact design of an electronic device included in a high-frequency circuit.

SUMMARY OF THE INVENTION

To overcome the problems described above, preferred embodiments of the present invention provide an improved multi-layer capacitor which achieves a very low ESL value and provide a wiring board and a high-frequency circuit, both of which incorporate the multi-layer capacitor which achieves very low ESL.

A multi-layer capacitor of a preferred embodiment of the present invention includes a capacitor body having two opposing major surfaces and four side surfaces joining the two opposing major surfaces. The capacitor body includes a plurality of dielectric layers extending parallel to the major surfaces and at least one pair of first and second internal electrodes which are opposed to each other with a particular dielectric layer interposed therebetween to define a capacitor unit.

The multi-layer capacitor of the present invention is constructed to overcome the problems with conventional devices. More specifically, a first side-surface terminal electrode and a second side-surface terminal electrode are provided on at least one of the side surfaces of the capacitor body, while at least one major-surface terminal electrode is provided on at least one of the major surfaces of the capacitor body.

The first side-surface terminal and the second side-surface terminal are respectively electrically connected to the first internal electrode and the second internal electrode, while one of the first internal electrode and the second internal electrode is electrically connected to the major-surface terminal electrode through a via hole conductor penetrating the dielectric layer.

The first side-surface terminal electrode and the second side-surface terminal electrode are preferably provided on each of two side surfaces, and are more preferably provided on each of the four side surfaces.

The first side-surface terminal electrode and the second side-surface terminal electrode are preferably arranged adjacent to each other on each of the side surfaces, and are more preferably arranged adjacent to each other along each of the four side surfaces.

The major-surface terminal electrode may be provided on one of the two major surfaces or may be provided on each of the two major surfaces.

The via hole conductor may include a portion which penetrates the internal electrode in a manner such that the via hole conductor remains electrically isolated from the internal electrode which is not connected thereto, This arrangement is implemented when a plurality of internal electrodes, i.e., the first and second internal electrodes, are included.

The major-surface terminal electrodes preferably include a first major-surface terminal electrode and a second major-surface terminal electrode, which are respectively electrically connected to the first internal electrode and the second internal electrode. In this case, the first major-surface terminal electrode and the second major-surface terminal electrode may be provided on only one of the two major-surfaces or may be provided on each of the two major surfaces. In each of the major surfaces, the one arranged closest to the first major-surface terminal electrode is preferably the second major-surface terminal electrode and the one arranged closest to the second major-surface terminal electrode is preferably the first major-surface terminal electrode.

When the first and second major-surface terminal electrodes are arranged, the first major-surface terminal electrode may be provided on one major surface while the second major-surface terminal electrode may be provided on the other major surface.

Preferably, the via hole conductors include a first via hole conductor which electrically connects the first internal electrode to the first major-surface terminal electrode such that the first via hole remains electrically isolated from the second internal electrode, and a second via hole conductor which electrically connects the second internal electrode to the second major-surface terminal electrode such that the second via hole remains electrically isolated from the first internal electrode.

The side-surface terminal electrodes may include an electrode which straddles two adjacent side surfaces.

Preferably, the major surface of the capacitor body of preferred embodiments of the present invention is generally square.

The multi-layer capacitor of preferred embodiments of the present invention is useful as a decoupling capacitor connected to an electrical circuit of a microprocessing unit chip in a microprocessing unit.

In addition, a multi-layer capacitor according to preferred embodiments of the present invention may be included in and mounted on a wiring board. A microprocessing unit chip may be mounted on a wiring board of this preferred embodiment of the present invention.

Preferably, the major-surface terminal electrode on the multi-layer capacitor is connected to the wiring board using a bump connecting electrode. The side-surface terminal electrode of the multi-layer capacitor may be connected to the wiring board.

Further, another preferred embodiment of the present invention may be a high-frequency circuit incorporating the multi-layer capacitor of various preferred embodiments of the present invention.

Other features, elements, characteristics and advantages of the present invention will be described in detail below with reference to the attached drawings.

BRIEF DESCRIPTION OF THE DRAWINGS

FIG. 3A and FIG. 3B are sectional views showing the internal construction of the multi-layer capacitor of FIG. 1, wherein FIG. 3A shows a cross section along which a first internal electrode extends, and FIG. 3B shows a cross section along which a second internal electrode extends;

DETAILED DESCRIPTION OF PREFERRED EMBODIMENTS

Figure 1:
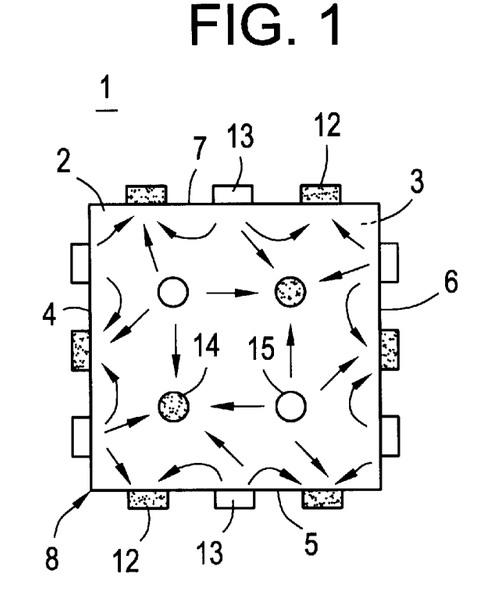
FIG. 1 is a plan view diagrammatically showing a multi-layer capacitor of a first preferred embodiment of the present invention.
Figure 2:
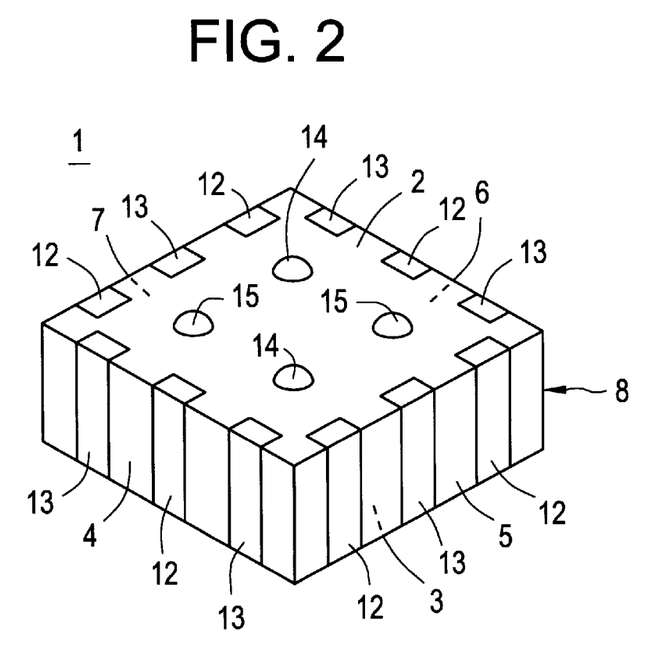
FIG. 2 is a perspective view showing the external appearance of the multi-layer capacitor of FIG. 1.
Figure 3A:
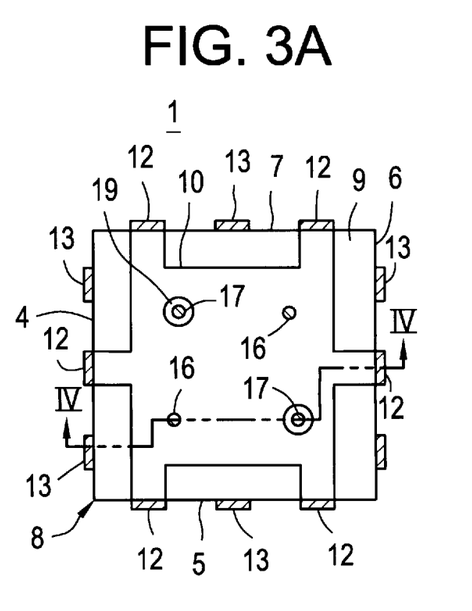
Figure 3B:
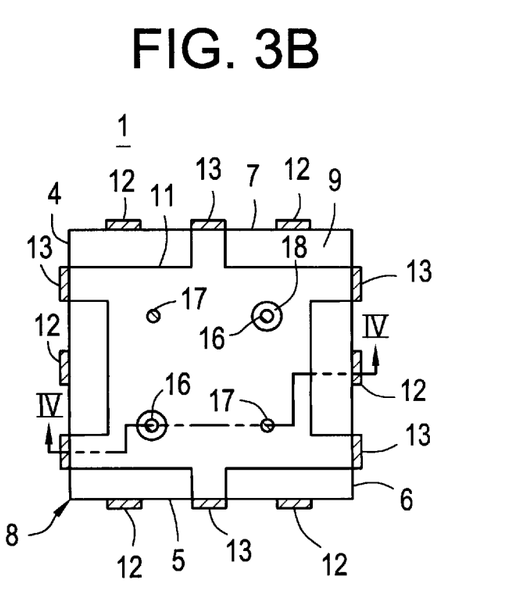
Figure 4:
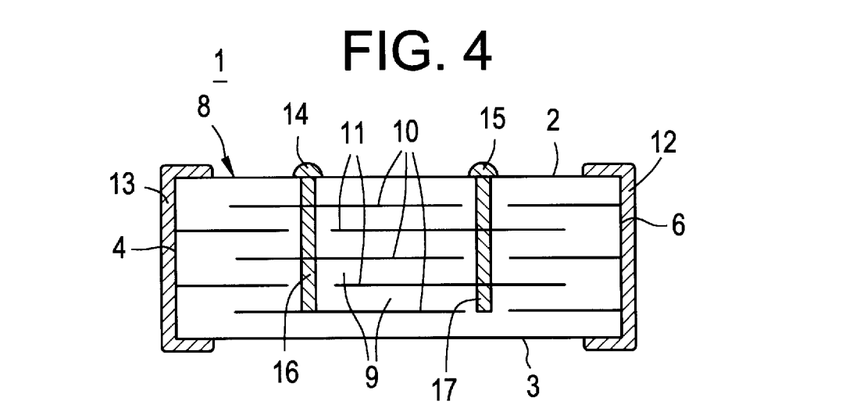
FIG. 4 is a cross-sectional view of the multi-layer capacitor of FIG. 1, taken along lines IV—IV in FIGS. 3A and 3B.

FIG. 1 through FIG. 4 show a multi-layer capacitor 1, according to a first preferred embodiment of the present invention. FIG. 1 is a plan view diagrammatically showing the layout of terminal electrodes of the multi-layer capacitor 1. FIG. 2 is a perspective view showing the external appearance of the multi-layer capacitor 1. FIGS. 3A and 3B are sectional views showing the internal construction of the multi-layer capacitor 1, illustrating different cross sections thereof. FIG. 4 is a cross-sectional view of the multi-layer capacitor 1, taken along lines IV—IV in FIGS. 3A and 3B.

The multi-layer capacitor 1 includes a capacitor body 8 having two opposing major surfaces 2 and 3 and four side surfaces 4, 5, 6 and 7 joining the major surfaces 2 and 3. In this preferred embodiment, the major surfaces 2 and 3 are preferably substantially square.

The capacitor body 8 includes a plurality of dielectric layers 9, for example, made of ceramic dielectric, extending parallel to the major surfaces 2 and 3 and a plurality of pairs of a first internal electrode 10 and a second internal electrode 11 which are opposed to each other with a particular dielectric layer 9 interposed therebetween to define a capacitor unit. In this preferred embodiment, the first and second internal electrodes 10 and 11 have shapes which are preferably substantially identical to each other but are arranged so as to be rotated by about 90 degrees relative to each other. As for the internal electrode pattern, a single type pattern only is preferably used, thereby simplifying the manufacturing of the capacitor.

In this specification, the "capacitor unit" refers to a minimum unit that creates capacitance with a pair of internal electrodes.

A plurality of first and second side-surface terminal electrodes 12 and 13 in the form of bands extend along the side surfaces 4 through 7 of the capacitor body 8 and further extend to partly cover the major surfaces 2 and 3.

More specifically, a total of three side-surface terminal electrodes are preferably provided on each of the side surfaces 4 through 7. The first side-surface terminal electrodes 12 and the second side-surface terminal electrodes 13 are alternately arranged with one first side-surface terminal electrode 12 being adjacent to one second side-surface terminal electrode 13, along the four side surfaces 4 through 7.

A plurality of first and second major-surface terminal electrodes 14 and 15 preferably in the form of substantially circular members are provided on one major surface 2 of the capacitor body 8.

In this preferred embodiment, two first major-surface terminal electrodes 14 and two second major-surface terminal electrodes 15 are preferably provided on the major surface 2 such that the one arranged closest to the first major-surface terminal electrode 14 is the second major-surface terminal electrode 15 and such that the one arranged closest to the second major-surface terminal electrode 15 is the first major-surface terminal electrode 14.

FIG. 3A shows a cross section along which the first internal electrode 10 extends, while FIG. 3B shows a cross section along which the second internal electrode 11 extends.

Referring to FIG. 3A and FIG. 4, the first internal electrode 10 extends to each of the four side surfaces 4 through 7, and is electrically connected at its ends to the first side-surface terminal electrodes 12.

Referring to FIG. 3B and FIG. 4, the second internal electrode 11 extends to each of the four side surfaces 4 through 7, and is electrically connected at its ends to the second side-surface terminal electrodes 13.

First via hole conductors 16, penetrating particular dielectric layers 9, are arranged within the capacitor body 8 to electrically connect the first internal electrodes 10 to the first major-surface terminal electrodes 14. Second via hole conductors 17, penetrating particular dielectric layers 9, are arranged within the capacitor body 8 to electrically connect the second internal electrodes 11 to the second major-surface terminal electrodes 15.

To create a large capacitance in this preferred embodiment, a plurality of the first internal electrodes 10 and the second internal electrodes 11 are alternately arranged in the direction of the lamination of the dielectric layers 9 and a plurality of pairs of opposing portions of the respective electrodes face each other, thereby defining a plurality of capacitor units. The plurality of capacitor units are connected in parallel through the first and second via hole conductors 16 and 17.

With this arrangement, the first via hole conductor 16 penetrates and extends through the second internal electrodes 11, while electrically connecting the plurality of first internal electrodes 10. The second via hole conductor 17 penetrates and extends through the first internal electrodes 10, while electrically connecting the plurality of second internal electrodes 11.

The second internal electrode 11 has, around the first via hole conductor 16, a gap 18 by which the first via hole conductor 16 is electrically isolated from the second internal electrode 11. The first internal electrode 10 has, around the second via hole conductor 17, a gap 19 by which the second via hole conductor 17 is electrically isolated from the first internal electrode 10.

FIG. 1 shows the layout of the terminal electrodes 12 through 15 of the multi-layer capacitor 1 thus constructed. Referring to FIG. 1, the side-surface terminal electrodes 12 and 13 are shown to have a substantially rectangular shape but may have other shapes. To differentiate between the first side-surface terminal electrode 12 and the second side-surface terminal electrode 13, the first side-surface terminal electrode 12 is shown in black. The first major-surface terminal electrodes 14 and the second major-surface terminal electrodes 15 are shown to have a substantially circular shape but may have other shapes. To differentiate between the first major-surface terminal electrode 14 and the second major-surface terminal electrode 15, the first major-surface terminal electrode 14 is shown in black.

Typical currents flowing in this preferred embodiment of the multi-layer capacitor are shown by arrows in FIG. 1.

Referring to FIG. 1, currents flow in a variety of directions in the approximate center portion of the major surface 2 and in the vicinity of the side surfaces 4 through 7 in the capacitor body 8 in the multi-layer capacitor 1. Magnetic fluxes created by these currents are efficiently canceled, and the generation of the magnetic fluxes is thus controlled. The length of current-carrying path is accordingly shortened. As a result, the ESL value of the multi-layer capacitor 1 is greatly reduced so as to have a very low value.

Since the major surfaces 2 and 3 of the capacitor body 8 of the multi-layer capacitor 1 are generally square, the first and second side-surface terminal electrodes 12 and 13, and the major-surface terminal electrodes 14 and 15 are easily arranged in a balanced layout to increase the cancellation effect of magnetic flux, compared with a capacitor body having a rectangular shape. This further decreases the ESL value.

Figure 5:
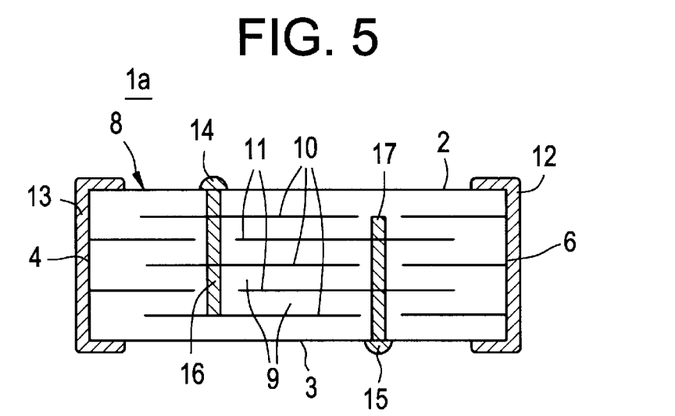
FIG. 5 is a cross-sectional view of a multi-layer capacitor of a second preferred embodiment of the present invention, corresponding to FIG. 4.

FIG. 5 shows a second preferred embodiment of the present invention, and corresponds to FIG. 4, which shows the first preferred embodiment. Referring to FIG. 5, elements identical to those described with reference to FIG. 4 are designated with the same reference numerals, and the description of these common elements is not repeated here.

In a multi-layer capacitor 1a shown in FIG. 5, a first major-surface terminal electrode 14 is disposed on one major surface 2, while a second major-surface terminal electrode 15 is disposed on the other major surface 3.

Figure 6:
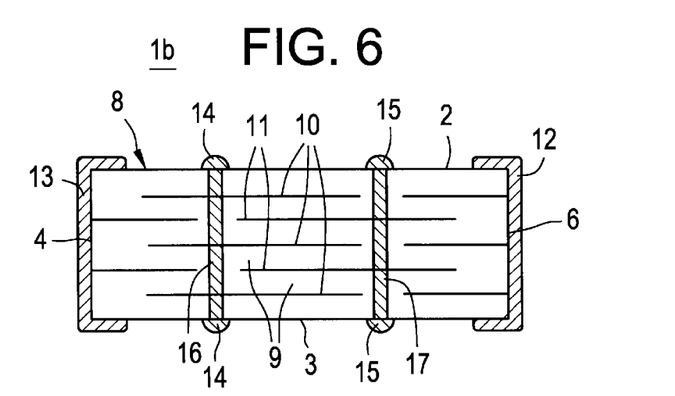
FIG. 6 is a cross-sectional view of a multi-layer capacitor of a third preferred embodiment of the present invention, corresponding to FIG. 4.

FIG. 6 shows a third preferred embodiment of the present invention, and corresponds to FIG. 4, which shows the first preferred embodiment. Referring to FIG. 6, elements identical to those described with reference to FIG. 4 are designated with the same reference numerals, and the description about the common elements is not repeated here.

In a multi-layer capacitor 1b shown in FIG. 6, a first major-surface terminal electrode 14 and second major-surface terminal electrode 15 are provided on each of the two major surfaces 2 and 3.

The layout of the terminal electrodes 12 through 15 in the multi-layer capacitor 1a shown in FIG. 5 and the multi-layer capacitor 1b shown in FIG. 6 may be also shown as the layout of the multi-layer capacitor 1 is shown in FIG. 1.

In the multi-layer capacitor 1 shown in FIG. 1 through FIG. 4, the directions of the currents flowing through the first and second via hole conductors 16 and 17 are opposite in the cross section shown in FIG. 4. In the multi-layer capacitor 1a shown in FIG. 5 and the multi-layer capacitor 1b shown in FIG. 6, the directions of the currents flowing through the first and second via hole conductors 16 and 1 are the same. From this, the multi-layer capacitor 1 shown in FIG. 1 outperforms the multi-layer capacitors 1a and 1b in the reduction of the ESL value.

Figure 7:
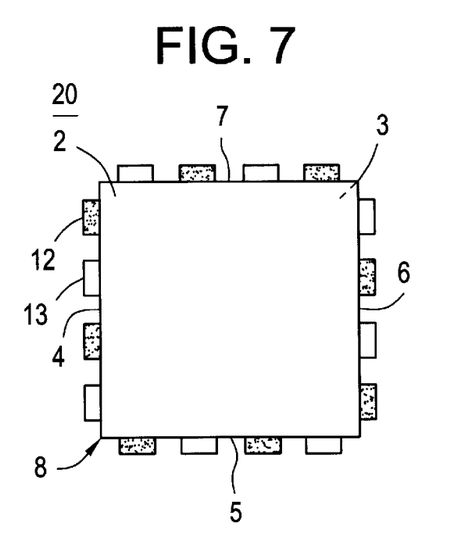
FIG. 7 is a plan view diagrammatically showing a multi-layer capacitor, as a first comparative example in comparison with the multi-layer capacitor shown in FIG. 1.
Figure 8:
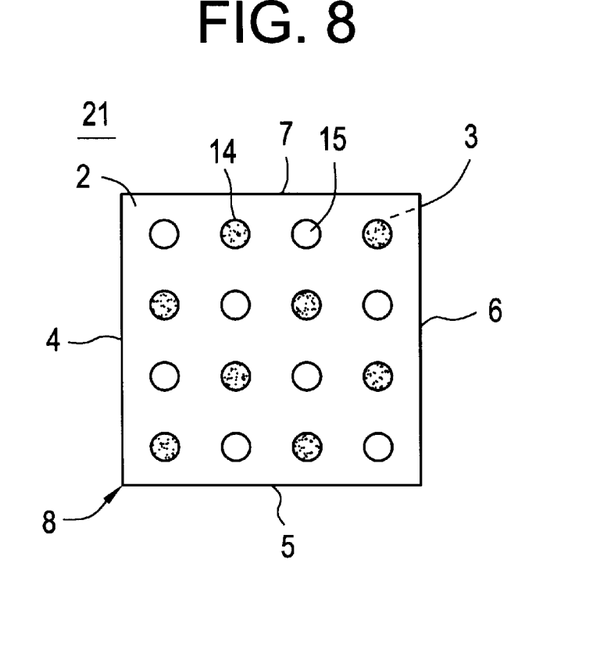
FIG. 8 is a plan view diagrammatically showing a multi-layer capacitor, as a second comparative example in comparison with the multi-layer capacitor shown in FIG. 1.

To verify the effectiveness of the multi-layer capacitor 1 shown in FIG. 1 through FIG. 4 in the reduction of the ESL value, a multi-layer capacitor 20 as a comparative example 1 shown in FIG. 7 and a multi-layer capacitor 21 as a comparative example 2 shown in FIG. 8 are prepared. FIG. 7 and FIG. 8 respectively show the multi-layer capacitor 20 and the multi-layer capacitor 21 in the same manner as FIG. 1 shows the multi-layer capacitor 1. For ease of comparison, like components are designated with like reference numerals.

The multi-layer capacitor 1 shown in FIG. 1 preferably includes a total of sixteen terminal electrodes 12 through 15, including the six first side-surface terminal electrodes 12, the six second side-surface terminal electrodes 13, the two first major-surface terminal electrodes 14, and the two second major-surface terminal electrodes 15. In the multi-layer capacitors 20 and 21 respectively shown in FIG. 7 and FIG. 8, sixteen electrodes 12 through 15 are also provided.

More specifically, the multi-layer capacitor 20 shown in FIG. 7 has a total of sixteen electrodes, namely, eight first side-surface terminal electrodes 12 and eight second side-surface terminal electrodes 13. The multi-layer capacitor 21 shown in FIG. 8 has a total of sixteen electrodes, namely, eight first major-surface terminal electrodes 14 and eight second major-surface terminal electrodes 15.

The multi-layer capacitors 1, 20, and 21 have capacitor bodies 8 which are identical in shape and dimensions. The dimensions of the major surfaces of each capacitor body 8 is preferably, for example, about 2.5 mm by about 2.5 mm.

These multi-layer capacitors commonly include a total number of sixteen electrodes and a capacitor body 8 having identical shape and dimensions. The frequency characteristics of the multi-layer capacitors 1, 20, and 21 are measured using a network analyzer to determine ESL values from self-resonance frequencies. The multi-layer capacitor 1 shown in FIG. 1 achieves an ESL of 12 pH, the multi-layer capacitor 20 shown in FIG. 7 has an ESL of 16 pH, and the multi-layer capacitor 21 shown in FIG. 8 has an ESL of 24 pH.

From these results, given the same total number of electrodes 12 through 15, forming the first and second side-surface terminal electrodes 12 and 13 and the first and second major-surface terminal electrodes 14 and 15 presents a lower ESL value as compared to forming the first and second side-surface terminal electrodes 12 and 13 only or forming the first and second major-surface terminal electrodes 14 and 15 only.

With the terminal electrodes provided on the side surfaces and the major surfaces at the same time, an interaction efficiently works to control the generation of magnetic fluxes, thereby providing a very low ESL capacitor, which is not achievable with the arrangement of the electrodes on the side surfaces only or on the major surfaces only.

FIG. 9 through FIG. 16 show other preferred embodiments of the present invention. These figures show the respective preferred embodiments in a manner similar to FIG. 1. Referring to FIG. 9 through FIG. 16, elements identical to those described with reference to FIG. 1 are designated with the same reference numerals, and the description of common elements is not repeated here.

Figure 9:
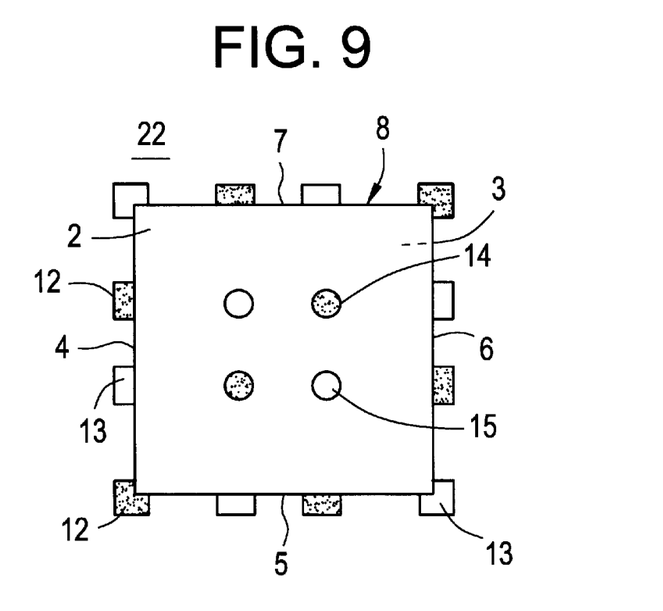
FIG. 9 is a plan view diagrammatically showing a multi-layer capacitor of a fourth preferred embodiment of the present invention.

In a multi-layer capacitor 22 shown in FIG. 9, two of the first side-surface terminal electrodes 12 and two of the second side-surface terminal electrodes 13 respectively straddle two adjacent side surfaces, i.e., adjacent side surfaces 4 and 5, 5 and 6, 6 and 7, and 7 and 4.

The multi-layer capacitor 22 shown in FIG. 9 achieves an even lower ESL value than the multi-layer capacitor 1 shown in FIG. 1. More specifically, an ESL of 8 pH results when the multi-layer capacitor 22 having the capacitor body 8 identical to that in the preceding preferred embodiments is tested.

If the first major-surface terminal electrodes 14 and the second major-surface terminal electrodes 15 are provided on each of the two major surfaces 2 and 3 as shown in FIG. 6 in the multi-layer capacitor 22 shown in FIG. 9, the ESL value slightly rises, becoming an ESL of 12 pH.

Figure 10:
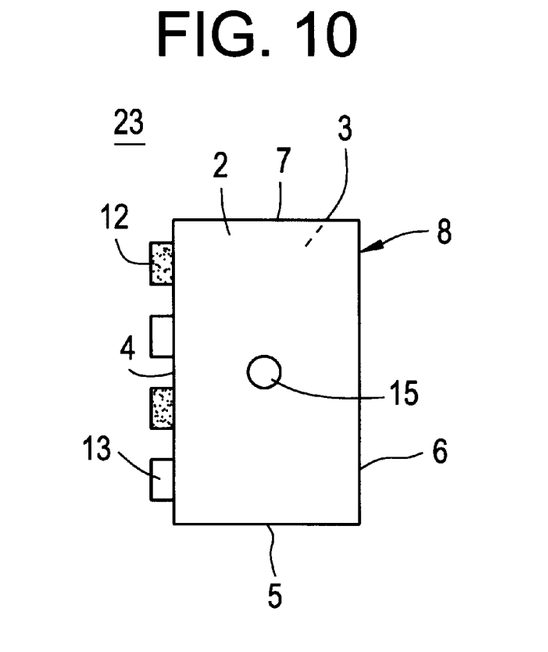
FIG. 10 is a plan view diagrammatically showing a multi-layer capacitor of a fifth preferred embodiment of the present invention.
Figure 11:
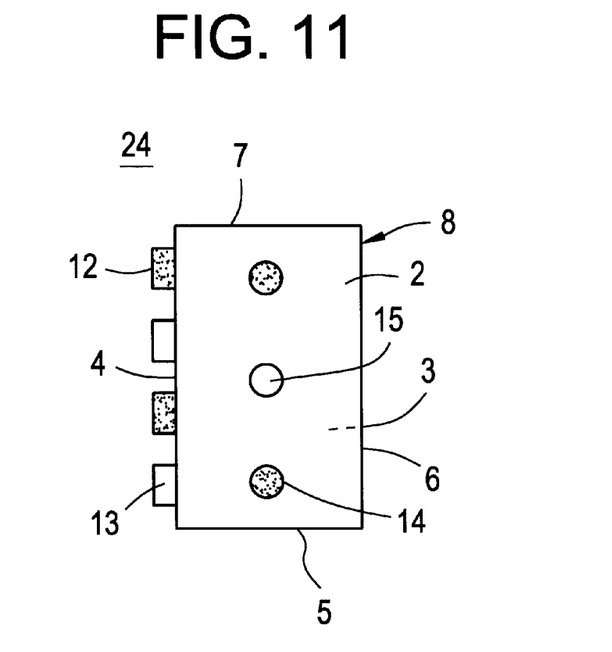
FIG. 11 is a plan view diagrammatically showing a multi-layer capacitor of a sixth preferred embodiment of the present invention.
Figure 12:
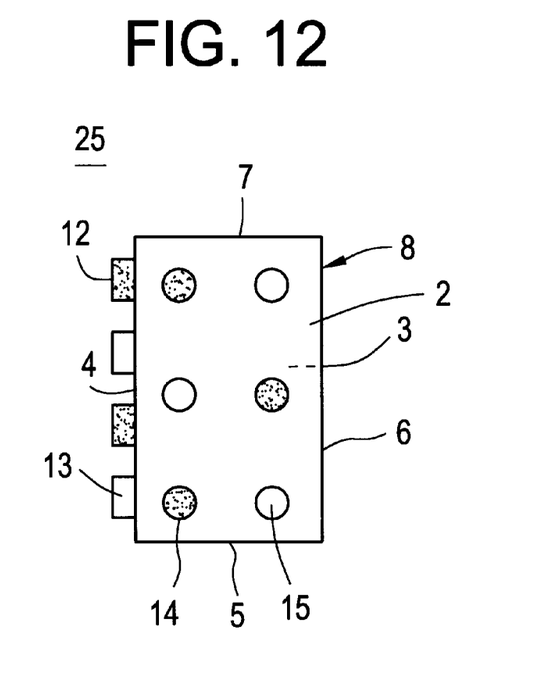
FIG. 12 is a plan view diagrammatically showing a multi-layer capacitor of a seventh preferred embodiment of the present invention.
Figure 13:
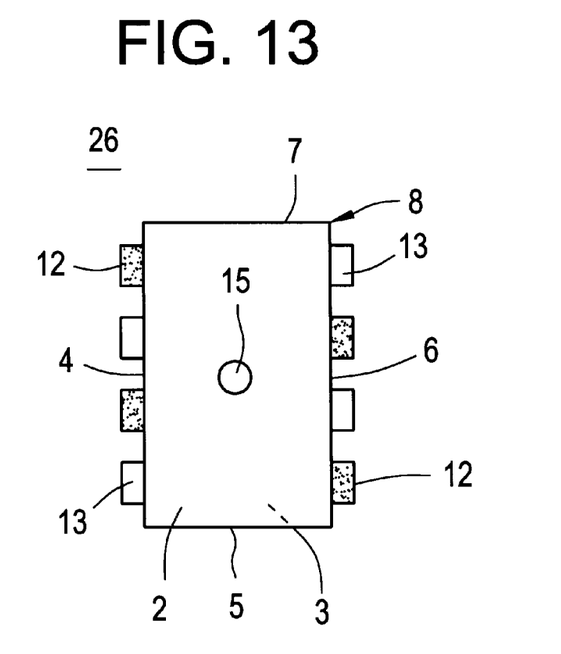
FIG. 13 is a plan view diagrammatically showing a multi-layer capacitor of an eighth preferred embodiment of the present invention.
Figure 14:
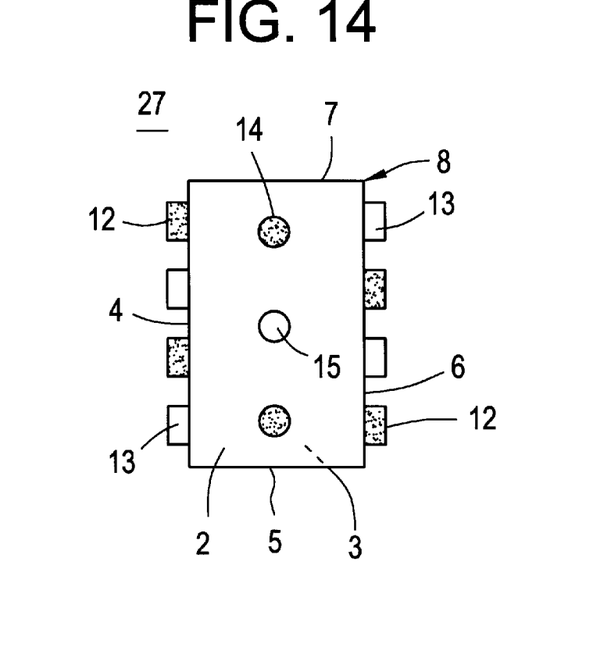
FIG. 14 is a plan view diagrammatically showing a multi-layer capacitor of a ninth preferred embodiment of the present invention.

A multi-layer capacitor 23 shown in FIG. 10, a multi-layer capacitor 24 shown in FIG. 11, a multi-layer capacitor 25 shown in FIG. 12, a multi-layer capacitor 26 shown in FIG. 13, and a multi-layer capacitor 27 shown in FIG. 14 all include a capacitor body 8 having substantially rectangular major surfaces 2 and 3.

The multi-layer capacitors 23 through 25 include two first side-surface terminal electrodes 12 and two second side-surface terminal electrodes 13, disposed on only one side surface 4 which joins the longer sides of the major surfaces 2 and 3. The multi-layer capacitors 26 and 27 include two first side-surface terminal electrodes 12 and two second side-surface terminal electrodes 13, disposed on one side surface 4 which joins the longer sides of the major surfaces 2 and 3, and also two first side-surface terminal electrodes 12 and two second side-surface terminal electrodes 13, disposed on the other side surface 6 opposed to the side surface 4.

The multi-layer capacitors 23 and 26 have each a single major-surface terminal electrode 15, the multi-layer capacitors 24 and 27 have each a total of three first and second major-surface terminal electrodes 14 and 15, and the multi-layer capacitor 25 has a total of six first and second major-surface terminal electrodes 14 and 15.

The ESL values of the multi-layer capacitors 23 through 27 with the major surfaces having dimensions of, for example, about 3.2 mm by about 1.6 mm are determined as follows.

The multi-layer capacitor 23 has an ESL of 152 pH, the multi-layer capacitor 24 has an ESL of 84 pH, and the multi-layer capacitor 25 has an ESL of 67 pH. The larger the number of the first and second major-surface terminal electrodes 14 and 15, the smaller the ESL value. A multi-layer capacitor having no major-surface terminal electrodes, specifically, the multi-layer capacitor 23 having no second major-surface terminal electrodes 15, has an ESL of 212 pH.

The multi-layer capacitor 26 has an ESL of 75 pH, and the multi-layer capacitor 27 has an ESL of 43 pH. A multi-layer capacitor having no major-surface terminal electrodes, specifically, the multi-layer capacitor 26 having no second major-surface terminal electrodes 15, has an ESL of 102 pH.

The comparison of the multi-layer capacitor 26 to the multi-layer capacitor 27 also shows that the larger the number of the first and second major-surface terminal electrodes 14 and 15, the smaller the ESL value.

By comparison of the multi-layer capacitor 23 to the multi-layer capacitor 26, and the multi-layer capacitor 24 to the multi-layer capacitor 27, increasing the number of side surfaces 4 through 7 including the first and second side-surface terminal electrodes 12 and 13 while increasing the number of the first and second side-surface terminal electrodes 12 and 13 proves to be effective in the reduction of the ESL value.

Figure 15:
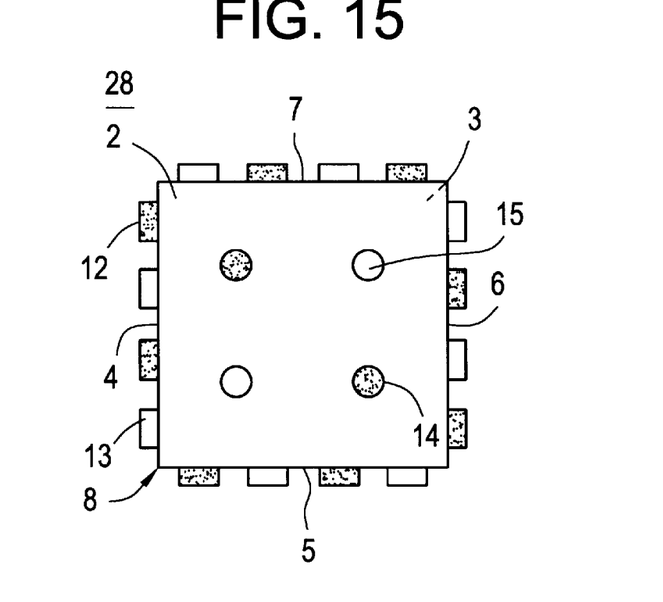
FIG. 15 is a plan view diagrammatically showing a multi-layer capacitor of a tenth preferred embodiment of the present invention.

A multi-layer capacitor 28 shown in FIG. 15 includes a total of sixteen side-surface terminal electrodes 12 and 13, i.e., two first side-surface terminal electrodes 12 and two second side-surface terminal electrodes 13 provided on each of the four side surfaces 4 through 7.

From the above preferred embodiments, the number of and locations of the first and second side-surface terminal electrodes 12 and 13 are modified as necessary. Similarly, the number and arrangement of the first and second major-surface terminal electrodes 14 and 15 are modified as necessary.

Figure 16:
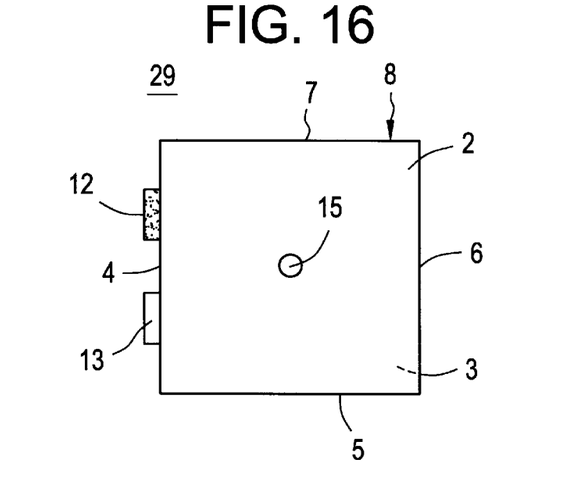
FIG. 16 is a plan view diagrammatically showing a multi-layer capacitor of an eleventh preferred embodiment of the present invention.

A multi-layer capacitor 29 shown in FIG. 16 has a minimum number of elements which the multi-layer capacitor within the scope of the present invention requires in connection with the side-surface terminal electrode and the major-surface terminal electrode. More specifically, one first side-surface terminal electrode 12 and one second side-surface terminal electrode 13 are provided on the side surface 4 while one second major-surface terminal electrode 15 is provided on one major surface 2.

The multi-layer capacitor of preferred embodiments of the present invention is useful as the decoupling capacitor 35 in the MPU 31 shown in FIG. 19. The construction of the MPUs incorporating the multi-layer capacitor of preferred embodiments of the present invention as a decoupling capacitor are now described referring to FIG. 17 and FIG. 18.

Figure 17:
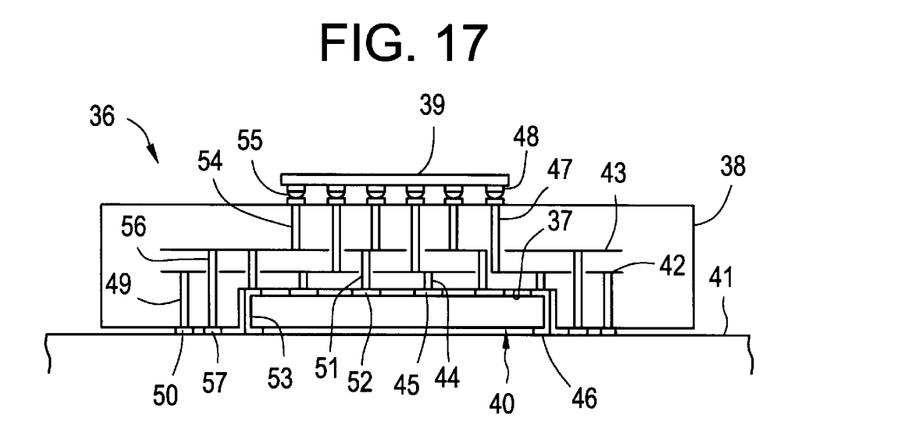
FIG. 17 is a cross-sectional view diagrammatically showing the construction of a microprocessing unit which includes a multi-layer capacitor of preferred embodiments of the present invention which defines a decoupling capacitor.

Referring to FIG. 17, an MPU 36 includes a multi-layer wring board 38 having a cavity 37 on its lower surface. An MPU chip 39 is surface-mounted on the wiring board 38. A multi-layer capacitor 40 according to one of the preferred embodiments of the present invention described above which functions as a decoupling capacitor is housed in the cavity 37 of the wiring board 38. The wiring board 38 is surface-mounted on a mother board 41.

As diagrammatically shown, wiring conductors required for MPU 36 are provided on the surface of or inside the wiring board 38. Through these wiring conductors, the connections shown in FIG. 19 are established.

Now typical connections are discussed. A power supply hot electrode 42 and a ground electrode 43 are provided inside the wiring board 38.

The power supply hot electrode 42 is electrically connected to a particular major-surface terminal electrode 45 and a particular side-surface terminal electrode 46 of the multi-layer capacitor 40 through a via hole conductor 44, is electrically connected to a particular terminal 48 of the MPU chip 39 through a via hole conductor 47, and is further electrically connected to a hot conductor land 5b of the mother board 41 through a via hole conductor 49.

The ground electrode 43 is electrically connected to a particular major-surface terminal electrode 52 and a particular side-surface terminal electrode 53 of the multi-layer capacitor 40 through via hole conductors 51, is electrically connected to a particular terminal 55 of the MPU chip 39 through a via hole conductor 54, and is further electrically connected to a, ground conductor land 57 of the mother board 41 through a via hole conductor 56.

The major-surface terminal electrodes 45 and 52 of the multi-layer capacitor 40 are respectively connected to the via hole conductors 44 and 51 using bump, although they are not shown in FIG. 17.

A memory corresponding to the memory 34 shown in FIG. 19 is not shown in FIG. 17.

Figure 18:
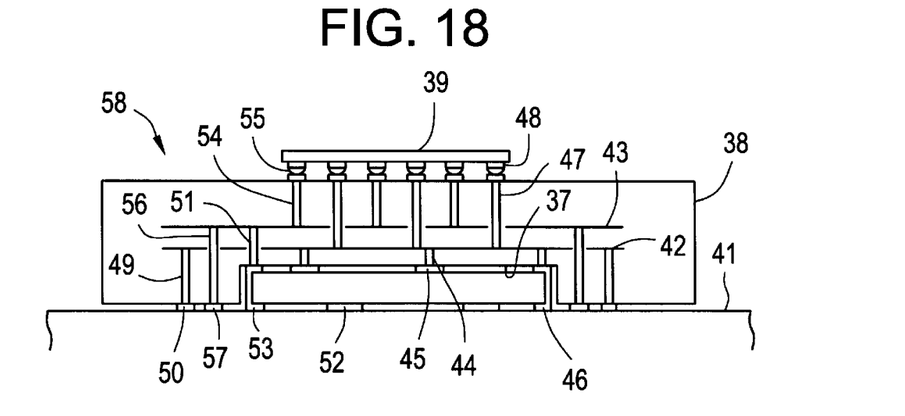
FIG. 18 is a cross-sectional view diagrammatically showing the construction of a microprocessing unit which includes a multi-layer capacitor of preferred embodiments of the present invention which defines a decoupling capacitor, wherein the microprocessing unit has a construction different from that of the microprocessing unit shown in FIG. 17.

The MPU 58 shown in FIG. 18 and the MPU 36 shown in FIG. 17 share a number of elements in common. Like elements are designated with like reference numerals, and the discussion about the common elements is not repeated.

In the multi-layer capacitor 40 incorporated in MPU 36 shown in FIG. 17, all major-surface terminal electrodes 45 and 52 are preferably provided on the one major surface in the same manner as in the preferred embodiment shown in FIG. 4. In a multi-layer capacitor 59 incorporated in MPU 58 shown in FIG. 18, the major-surface terminal electrodes 45 only are provided on the one major surface while the major-surface terminal electrodes 52 are provided on the other major surface, in the same manner as in the preferred embodiment shown in FIG. 5.

With this arrangement, the major-surface terminal electrodes 45 are electrically connected to the power supply hot electrode 42 through the via hole conductor 44, while the major-surface terminal electrodes 52 are electrically directly connected to a ground conductor land of the mother board 41.

The major-surface terminal electrodes 45 and 52 of the above-referenced multi-layer capacitor 59 are also connected using bumps, although the bumps are not shown in detail in FIG. 18.

A memory corresponding to the memory 34 shown in FIG. 19 is not shown in FIG. 18.

In the multi-layer capacitor of preferred embodiments of the present invention, the first and second side-surface terminal electrodes are provided on at least one of the side surfaces of the capacitor body, the major-surface terminal electrodes are disposed on at least one of the major surfaces of the capacitor body, the first and second internal electrodes are electrically connected at respective ends thereof to the first side-surface terminal electrodes which are opposed to each other with the dielectric layer interposed therebetween, and one of the first and second internal electrodes is connected to the major-surface terminal electrode via the via hole conductor penetrating the dielectric layer. The directions of the currents flowing within the multi-layer capacitor are thus diversified, the magnetic fluxes are effectively canceled, and the lengths of current-carrying paths are shortened. As a result, the ESL value is greatly reduced.

With this arrangement, the resonance frequency of the multi-layer capacitor is heightened. The frequency range in which the multi-layer capacitor functions as a capacitor is much higher. The multi-layer capacitor of various preferred embodiments of the present invention satisfies and even exceeds the high-frequency requirement imposed on electronic circuits. For instance, the multi-layer capacitor of preferred embodiments of the present invention is useful as a bypass capacitor or a decoupling capacitor in a high-frequency circuit.

A quick power supply function is required of a decoupling capacitor, if it is used with an MPU chip. Because of its low ESL value, the multi-layer capacitor of preferred embodiments of the present invention meets a high-speed operational requirement in this application.

When the multi-layer capacitor is mounted on the wiring board, the major-surface terminal electrodes on the multi-layer capacitor of preferred embodiments of the present invention are conveniently connected using bumps. Bump connections tend to be widely used as the operating frequency increases in a semiconductor chip, such as an MPU. The use of the major-surface terminal electrodes conveniently matches the bump connection. Furthermore, the use of the bump connection achieves a high density mounting, and controls the generation of an inductance component in the connection.

Through the features of the present invention as discussed below, each of the above preferred embodiments of the present invention effectively and greatly lowers the ESL value by promoting the cancellation of magnetic fluxes, and shortening the lengths of the current-carrying paths.

As compared to conventional construction of multi-layer capacitors, there are many structural and functional differences in the preferred embodiments of the present invention. For example, the number of the side surfaces having the first and second side-surface terminal electrodes is increased to two, and to four. Also, the first side-surface terminal electrodes and the second side-surface terminal electrode are alternately arranged adjacent to each other on each side surface. The first side-surface terminal electrodes and the second side-surface terminal electrodes are alternately arranged adjacent to each other along each of the four side surfaces, and an even lower PSL value is obtained. Further, the first and second major-surface terminal electrodes as the major-surface terminal electrodes are respectively electrically connected to the first and second internal electrodes. If the first and second major-surface terminal electrodes are disposed on one major surface only, the ESL value is even more reduced. Further, when the first and second major-surface terminal electrodes are provided as the major-surface terminal electrodes on each of the major surfaces, the one arranged closest to the first major-surface terminal electrode is the second major-surface terminal electrode and the one arranged closest to the second major-surface terminal electrode is the first major-surface terminal electrode. In addition, some of the side-surface terminals straddle two adjacent side surfaces. Also, the major surface of the capacitor body is generally square.

It should be understood that the foregoing description is only illustrative of the preferred embodiments of the present invention. Various alternatives and modifications can be devised by those of skill in the art without departing from the present invention. Accordingly, the present invention is intended to embrace all such alternatives, modifications and variances which fall within the scope of the appended claims.

What is claimed is:

1. A multi-layer capacitor comprising:
   a capacitor body having two opposing major surfaces and four sides surfaces joining the two opposing major surfaces;

a plurality of dielectric layers disposed in the capacitor body so as to extend substantially parallel to the major surfaces;

at least one pair of first and second internal electrodes disposed in the capacitor body and opposed to each other with one of the dielectric layers interposed therebetween;

a first side-surface terminal electrode and a second side-surface terminal electrode disposed each of the side surfaces of the capacitor body; and at least one major-surface terminal electrode on at least one of the major surfaces of the capacitor body, wherein the at least one pair of first and second internal electrodes are respectively electrically connected at respective ends thereof to the first side-surface terminal and the second side-surface terminal, one of the at least one pair of first and second internal electrodes is electrically connected to the major-surface terminal electrode through a via hole conductor penetrating one of the dielectric layers.

2. A multi-layer capacitor according to claim 1, further comprising a plurality of the major-surface terminal electrodes provided on each of the two major surfaces.

3. A multi-layer capacitor according to claim 1, wherein the via hole conductor comprises a portion which penetrates one of the at least one pair of first and second internal electrodes such that the via hole conductor is electrically isolated from the one of the at least one pair of first and second internal electrodes which is not connected thereto.

4. A multi-layer capacitor according to claim 1, further comprising a plurality of the major-surface terminal electrodes including a first major-surface terminal electrode and a second major-surface terminal electrode, which are respectively electrically connected to the at least one pair of first and second internal electrodes.

5. A multi-layer capacitor according to claim 4, wherein the first major-surface terminal electrode and the second major-surface electrode are provided on one major surface only.

6. A multi-layer capacitor according to claim 5, wherein, in each of the major surfaces, the one arranged closest to the first major-surface terminal electrode is the second major-surface terminal electrode and the one arranged closest to the second major-surface terminal electrode is the first major-surface terminal electrode.

7. A multi-layer capacitor according to claim 4, wherein the first major-surface terminal electrode and the second major-surface terminal electrode are provided on each of the two major surfaces.

8. A multi-layer capacitor according to claim 4, wherein the first major-surface terminal electrode is disposed on one major surface while the second major-surface terminal electrode is disposed on the other major surface.

9. A multi-layer capacitor according to claim 4, further comprising a plurality of the via hole conductors including a first via hole conductor which electrically connects one of the at least one pair of first and second internal electrodes to the first major-surface terminal electrode such that the first via hole is electrically isolated from the other of the at least one pair of first and second internal electrodes, and a second via hole conductor which electrically connects the other of the at least one pair of first and second internal electrodes to the second major-surface terminal electrode such that the second via hole is electrically isolated from the one of the at least one pair of first and second internal electrodes.

10. A multi-layer capacitor according to claim 1, wherein the side-surface terminal electrodes comprise an electrode which straddles two adjacent side surfaces.

11. A multi-layer capacitor according to claim 1, wherein the two opposing major surfaces are substantially square.

12. A multi-layer capacitor according to claim 1, wherein the multi-layer capacitor is arranged to define a decoupling capacitor of a microprocessing unit chip in a microprocessing unit.

13. A wiring board including a multi-layer capacitor according to claim 1 mounted thereon.

14. A wiring board according to claim 13 comprising a microprocessing unit chip mounted thereon.

15. A high-frequency circuit comprising a multi-layer capacitor according to claim 1.

16. The multi-layer capacitor according to claim 1, wherein each of the at least one pair of first internal electrodes includes a main electrode portion and at least one extension portion extending from the main electrode portion to at least one of the side surfaces of the capacitor body.

17. The capacitor according to claim 1, wherein each of the at least one pair of first internal electrodes includes a main electrode portion and a plurality of extension portions extending from the main electrode portion to the side surfaces of the capacitor body.

18. A multi-layer capacitor comprising:

a capacitor body having two opposing major surfaces and four sides surfaces joining the two opposing major surfaces;

a plurality of dielectric layers disposed in the capacitor body so as to extend substantially parallel to the major surfaces;

at least one pair of first and second internal electrodes disposed in the capacitor body and opposed to each other with one of the dielectric layers interposed therebetween;

a first side-surface terminal electrode and a second side-surface terminal electrode disposed on each of the side surfaces of the capacitor body; and at least one major-surface terminal electrode on at least one of the major surfaces of the capacitor body, wherein the first internal electrode and the second internal electrode are respectively electrically connected at respective ends thereof to the first side-surface terminal and the second side-surface terminal, one of the first internal electrode and the second internal electrode is electrically connected to the major-surface terminal electrode through a via hole conductor penetrating the dielectric layer, wherein the first side-surface terminal electrode and the second side-surface terminal electrode are arranged adjacent to each other.

19. A multi-layer capacitor according to claim 18, wherein the first side-surface terminal electrode and the second side-surface terminal electrode are arranged adjacent to each other along an entire periphery of the capacitor body including the four side surfaces.

20. A multi-layer capacitor comprising:

a capacitor body having two opposing major surfaces and four side surfaces joining the two opposing major surfaces;

a plurality of dielectric layers disposed in the capacitor body so as to extend substantially parallel to the major surfaces;

a plurality of first and second polarity terminal electrodes alternately arranged on each of the four side surfaces; and at least one first polarity terminal electrode and at least one second polarity terminal electrode provided on at least one of the two opposing major surfaces.

21. A multi-layer capacitor according to claim 20, wherein a total number of the first and second polarity terminal electrodes on each of the four side surfaces is at least three.

22. A multi-layer capacitor according to claim 20, wherein a total number of the first and second polarity terminal electrodes on each of the four side surfaces is at least four.

23. A multi-layer capacitor according to claim 20, wherein one of the first polarity terminal electrodes is located adjacent to one of the second polarity terminal electrodes along an entire periphery of the capacitor body including four side surfaces.

24. A multi-layer capacitor according to claim 20, wherein at least two of the first polarity terminal electrodes and at least two of the second polarity terminal electrodes are provided on the at least one of the two opposing major surfaces.

25. A multi-layer capacitor according to claim 24, wherein the at least two of the first and second polarity terminal electrodes are alternately arranged such that one of the first polarity terminal electrodes is located adjacent to one of the second polarity terminal electrodes along the at least one of the two opposing major surfaces.

26. A multi-layer capacitor according to claim 20, further comprising at least one pair of first and second internal electrodes disposed in the capacitor body and opposed to each other with one of the dielectric layers interposed therebetween and electrically connected to the first and second polarity terminal electrodes, respectively.

27. A multi-layer capacitor according to claim 20, wherein at least one first polarity terminal electrode and at least one second polarity terminal electrode are provided on each of the two opposing major surfaces.

28. A multi-layer capacitor according to claim 20, wherein at least one of the first and second polarity electrodes straddles two adjacent side surfaces.

29. A multi-layer capacitor according to claim 20, wherein the capacitor body is substantially square.

30. A multi-layer capacitor according to claim 20, wherein the multi-layer capacitor is arranged to define a decoupling capacitor of a microprocessing unit chip in a microprocessing unit.

31. A wiring board including a multi-layer capacitor according to claim 20 mounted thereon.

32. A wiring board according to claim 31, comprising a microprocessing unit chip mounted thereon.

33. A high-frequency circuit comprising a multi-layer capacitor according to claim 20.

34. The capacitor according to claim 20, wherein each of the at least one pair of first internal electrodes includes a main electrode portion and at least one extension portion extending from the main electrode portion to at least one of the side surfaces of the capacitor body.

35. The capacitor according to claim 20, wherein each of the at least one pair of first internal electrodes includes a main electrode portion and a plurality of extension portions extending from the main electrode portion to the side surfaces of the capacitor body.

36. A capacitor comprising:
  a capacitor body made of a dielectric material and having two major surfaces opposed to each other and a plurality of side surfaces disposed between the two major surfaces;
  a plurality of first internal electrodes and at least one second internal electrode disposed in the dielectric material of the capacitor body and being arranged such that the plurality of first internal electrodes are disposed substantially parallel to the two major surfaces of the capacitor body and the at least one second internal electrode is disposed substantially perpendicular to the two major surfaces of the capacitor body; and
  a plurality of external electrodes disposed on each of the side surfaces of the capacitor body; wherein
    the capacitor body includes a first section in which said at least one second internal electrode is located and a second section in which said at least one second internal electrode is not located.

37. The capacitor according to claim 36, wherein said at least one second internal electrode is exposed at only one of the two major surfaces of the capacitor body.

38. The capacitor according to claim 37, further comprising at least one external electrode which is disposed on the one of the two major surfaces of the capacitor body and is electrically connected to the at least one second internal electrode.

39. The capacitor according to claim 38, wherein the at least one external electrode disposed on the one of the two major surfaces of the capacitor body is a first external electrode, the capacitor further comprising at least one second external electrode disposed on one of the two major surfaces of the capacitor body.

40. The capacitor according to claim 39, wherein the at least one second external electrode has a substantially rounded configuration and is arranged to achieve bump bonding connection.

41. The capacitor according to claim 36, further comprising a plurality of second internal electrodes that are electrically connected to respective ones of the plurality of first internal electrodes in the first section of the capacitor body.

42. The capacitor according to claim 36, wherein the dielectric material of the capacitor body includes dielectric material layers disposed between adjacent ones of the plurality of first internal electrodes.

43. The capacitor according to claim 36, further comprising a plurality of second internal electrodes, wherein the plurality of first internal electrodes includes a plurality of first internal electrode plates and second internal electrode plates, each having a plurality of holes therein, at least one of the plurality of second internal electrodes extending through respective ones of the plurality of holes.

44. The capacitor according to claim 43, wherein the plurality of first and second internal plates have a substantially rectangular plate configuration.

45. The capacitor according to claim 36, further comprising a plurality of external electrodes including a plurality of first polarity external electrodes and a plurality of second polarity external electrodes, wherein each of the first polarity external electrodes is located adjacent to at least one of the second polarity external electrodes.

46. The capacitor according to claim 36 further comprising a plurality of second internal electrodes, wherein the plurality of first internal electrodes are spaced from each other within the capacitor body by a first distanced the plurality of second internal electrodes are spaced from each other in the capacitor body by a second distance that is different from said first distance.

47. The capacitor according to claim 45, wherein the plurality of external electrodes disposed on the side surfaces of the capacitor body include at least four external electrodes disposed on each of the side surfaces of the capacitor body.

48. The capacitor according to claim 47, further comprising at least four external electrodes disposed on one of the two major surfaces of the capacitor body.

49. The capacitor according to claim 48, further comprising a plurality of second internal electrodes, wherein the at least four external electrodes disposed on one of the two major surfaces of the capacitor body are electrically connected to respective ones of the plurality of second internal electrodes.

50. The capacitor according to claim 36, wherein the capacitor is arranged to define a decoupling capacitor for a multiprocessing unit.

51. A high frequency circuit comprising at least one capacitor according to claim 36.

52. The high frequency circuit according to claim 51, wherein the at least one capacitor is arranged to define one of a bypass capacitor and a decoupling capacitor.

53. A circuit board comprising at least one capacitor according to claim 36.

54. The capacitor according to claim 36, wherein each of the plurality of first internal electrodes includes a main electrode portion and at least one extension portion extending from the main electrode portion to at least one of the side surfaces of the capacitor body.

55. The capacitor according to claim 36, wherein each of the plurality of first internal electrodes includes a main electrode portion and a plurality of extension portions extending from the main electrode portion to the side surfaces of the capacitor body.

56. A capacitor comprising:
  a capacitor body made of a dielectric material and having two major surfaces opposed to each other and a plurality of side surfaces disposed between the two major surfaces;
  a plurality of first internal electrodes and at least one second internal electrode disposed in the dielectric material of the capacitor body and being arranged such that the plurality of first internal electrodes are disposed substantially parallel to the two major surfaces of the capacitor body and the at least one second internal electrode is disposed substantially perpendicular to the two major surfaces of the capacitor body; and
  a plurality of external electrodes disposed on each of the side surfaces of the capacitor body; wherein
    the at least one second internal electrode is arranged to extend from one of the two major surfaces of the capacitor body toward the other of the two major surfaces of the capacitor body such that the at least one second internal electrode is connected to one of the plurality of first internal electrodes in a first section of the capacitor body and such that the at least one second internal electrode does not extend in a second section of the capacitor body.

57. The capacitor according to claim 56, wherein the first section and the second section are divided by an imaginary horizontal line extending substantially parallel to the two major surfaces of the capacitor body.

58. The capacitor according to claim 56, wherein the first horizontal section comprises an upper portion of the capacitor body and the second horizontal section comprises a lower portion of the capacitor body.

59. The capacitor according to claim 56, wherein the at least one second internal electrode is exposed at only one of the two major surfaces of the capacitor body.

60. The capacitor according to claim 59, further comprising at least one external electrode which is disposed on one of the two major surfaces of the capacitor body and is electrically connected to the at least one second internal electrode.

61. The capacitor according to claim 60, wherein the at least one external electrode disposed on one of the two major surfaces of the capacitor body is a first external electrode, the capacitor further comprising at least one second external electrodes disposed on one of the two major surfaces of the capacitor body.

62. The capacitor according to claim 61, wherein the at least one second external electrode has a substantially rounded configuration and is arranged to achieve bump bonding connection.

63. The capacitor according to claim 56, further comprising a plurality of second internal electrodes, wherein the plurality of second internal electrodes are electrically connected to respective ones of the plurality of first internal electrodes in the first section of the capacitor body.

64. The capacitor according to claim 56, wherein the dielectric material of the capacitor body includes dielectric material layers disposed between adjacent ones of the plurality of first internal electrodes.

65. The capacitor according to claim 56, wherein the capacitor is arranged to define a decoupling capacitor for a multiprocessing unit.

66. A high frequency circuit comprising at least one capacitor according to claim 56.

67. The high frequency circuit according to claim 66, wherein the at least one capacitor is arranged to define one of a bypass capacitor and a decoupling capacitor.

68. A circuit board comprising at least one capacitor according to claim 56.

69. The capacitor according to claim 56, wherein each of the plurality of first internal electrodes includes a main electrode portion and at least one extension portion extending from the main electrode portion to at least one of the side surfaces of the capacitor body.

70. The capacitor according to claim 56, wherein each of the plurality of first internal electrodes includes a main electrode portion and a plurality of extension portions extending from the main electrode portion to the side surfaces of the capacitor body.

71. A capacitor comprising:
  a capacitor body made of a dielectric material and having two major surfaces opposed to each other and a plurality of side surfaces disposed between the two major surfaces;
  a plurality of first internal electrodes and at least one second internal electrode disposed in the dielectric material of the capacitor body and being arranged such that the plurality of first internal electrodes are disposed substantially parallel to the two major surfaces of the capacitor body and the at least one second internal electrode is disposed substantially perpendicular to the two major surfaces of the capacitor body;
  wherein the plurality of first internal electrodes includes a plurality of first internal electrode plates and second internal electrode plates, each having a plurality of holes therein, the at least one of the second of second internal electrodes extending through respective ones of the plurality of holes; and
  a plurality of external electrodes disposed on each of the side surfaces of the capacitor body; wherein
    the at least one second internal electrode is arranged to extend from one of the two major surfaces of the capacitor body toward the other of the two major surfaces of the capacitor body such that the at least one second internal electrode is connected to one of the plurality of first internal electrodes in a first section of the capacitor body and such that the at least one second internal electrode does not extend in a second section of the capacitor body.

72. The capacitor according to claim 71, wherein the plurality of first and second internal plates have a substantially rectangular plate configuration.

73. A capacitor comprising:

a capacitor body made of a dielectric material and having two major surfaces opposed to each other and a plurality of side surfaces disposed between the two major surfaces;

a plurality of first internal electrodes and at least one second internal electrode disposed in the dielectric material of the capacitor body and being arranged such that the plurality of first internal electrodes are disposed substantially parallel to the two major surfaces of the capacitor body and the at least one second internal electrode is disposed substantially perpendicular to the two major surfaces of the capacitor body; and a plurality of the external electrodes including a plurality of first polarity external electrodes and a plurality of second polarity external electrodes, wherein each of the first polarity external electrodes is located adjacent to at least one of the second polarity external electrodes; wherein the at least one second internal electrode is arranged to extend from one of the two major surfaces of the capacitor body toward the other of the two major surfaces of the capacitor body such that the at least one second internal electrode is connected to one of the plurality of first internal electrodes in a first section of the capacitor body and such that the at least one second internal electrode does not extend in a second section of the capacitor body.

74. The capacitor according to claim 56, further comprising a plurality of second internal electrodes, wherein the plurality of first internal electrodes are spaced from each other within the capacitor body by a first distance and the plurality of second internal electrodes are spaced from each other in the capacitor body by a second distance that is different from said first distance.

75. The capacitor according to claim 73, wherein the plurality of external electrodes disposed on the side surfaces of the capacitor body include at least four external electrodes disposed on each of the side surfaces of the capacitor body.

76. The capacitor according to claim 75, further comprising at least four external electrodes disposed on one of the two major surfaces of the capacitor body.

77. The capacitor according to claim 76, further comprising a plurality of second internal electrodes, wherein the at least four external electrodes disposed on one of the two major surfaces of the capacitor body are electrically connected to respective ones of the plurality of second internal electrodes.

* * * * *